(12) United States Patent
Bosch et al.

(10) Patent No.: US 7,687,970 B2
(45) Date of Patent: Mar. 30, 2010

(54) ACTUATOR ARRANGEMENT

(75) Inventors: Russell Bosch, Gaines, MI (US); Michael Cooke, Gillingham (GB); Christopher Goat, Offham (GB)

(73) Assignee: Delphi Technologies, Inc., Troy, MI (US)

( * ) Notice: Subject to any disclaimer, the term of this patent is extended or adjusted under 35 U.S.C. 154(b) by 117 days.

(21) Appl. No.: 11/586,015

(22) Filed: Oct. 25, 2006

(65) Prior Publication Data

US 2007/0103030 A1    May 10, 2007

(30) Foreign Application Priority Data

Nov. 4, 2005    (EP)    .................................. 05256852

(51) Int. Cl.
*H01L 41/00* (2006.01)
(52) U.S. Cl. .................. 310/311; 310/328; 310/340
(58) Field of Classification Search ................. 310/340, 310/328, 311
See application file for complete search history.

(56) References Cited

U.S. PATENT DOCUMENTS

| | | | |
|---|---|---|---|
| 6,224,001 B1 * | 5/2001 | Cooke et al. ........... | 239/533.12 |
| 7,145,282 B2 * | 12/2006 | Oakley et al. ............... | 310/344 |
| 2004/0042726 A1 * | 3/2004 | Kersey et al. ................ | 385/37 |
| 2004/0113525 A1 * | 6/2004 | Hardy et al. ................ | 310/328 |
| 2006/0012266 A1 * | 1/2006 | Oakley et al. ............... | 310/328 |

FOREIGN PATENT DOCUMENTS

| | | |
|---|---|---|
| DE | 10046661 | 4/2002 |
| DE | 102004012863 | 10/2004 |
| EP | 0954037 | 3/1999 |
| WO | 2004034481 | 4/2004 |
| WO | 2004088123 | 10/2004 |

* cited by examiner

*Primary Examiner*—Walter Benson
*Assistant Examiner*—Bryan P Gordon
(74) *Attorney, Agent, or Firm*—Thomas N. Twomey

(57) ABSTRACT

An actuator arrangement comprising a piezoelectric actuator having a body section, a shroud which enshrouds at least part of the body section of the actuator, and at least one constrictive member disposed externally with respect to the shroud. The constrictive member applies a constrictive force to the shroud to maintain a seal between the shroud and the underlying body section of the actuator.

24 Claims, 6 Drawing Sheets

HOT

COLD

ACTUATOR ARRANGEMENT

TECHNICAL FIELD

The present invention relates to an actuator of the type comprising at least one piezoelectric element. In particular, the invention relates to a piezoelectric actuator for use in a fuel injector.

BACKGROUND OF THE INVENTION

In a known fuel injector, a piezoelectric actuator is operable to control the delivery of fuel into a combustion space. The piezoelectric actuator typically includes a stack of piezoelectric elements across which a voltage is applied in use through an electrical connector. A fuel injector of this type is described in the Applicant's granted patent EP 0995901.

It is known to arrange the piezoelectric stack within an accumulator volume in the injector that is arranged, in use, to receive high-pressure fuel. Commonly, therefore, the piezoelectric stack is immersed in fuel throughout its operational life. Moreover, when the fuel injection system is in use, the actuator is exposed to fuel at rail pressure ranging from, for example, 200 to 2000 bar. To protect the piezoelectric stack from damage, it is important that the stack is sealed off from fuel within the accumulator volume, in order to prevent the ingress of fuel into the joints between the individual elements forming the stack. It is also important to protect the piezoelectric stack from environmental contaminants such as moisture. The presence of a conductive fluid such as water in the stack can cause electrochemical effects and lead to a short circuit failure.

It is particularly important that when the actuator is used in a hydrostatically pressurized mode, as described for example in the Applicant's granted patent EP 1096137, the piezoelectric stack is protected from the ingress of hydrostatic pressurising fluid, as this could migrate into cracks in the structure and cause them to open up.

In EP 0995901, the piezoelectric stack is provided with a coating or sleeve composed of a flexible sealant material. The coating helps to seal the elements of the piezoelectric stack from fuel in the accumulator volume. Further, as the coating is flexible, the stack is subjected to the compressive load applied by the fuel under pressure, helping to reduce the propagation of cracks in the structure. For this purpose, it is known to use an over-moulding technique to encapsulate the piezoelectric stack within a plastics coating, or a sleeve member as described in the Applicant's granted patent application WO 02/061856. The coating or sleeve may also encapsulate the electrical connector, as described in the Applicant's granted patent EP 1079097. The sleeve is preferably formed from a fuel-resistant, low permeability fluoropolymer such as, for example, polyvinylidene fluoride (PVDF) or ethylene tetrafluoroethylene (ETFE).

It has been observed, however, that there may still be ingress of fluid into the interface between the actuator and the coating or sleeve. For example, the aforementioned sleeves are preferably formed from elastic or heat-shrink materials as tubes with open first and second ends such that the actuator can be inserted into the open tube. The tube is then allowed to contract elastically, or is made to contract by the application of heat, in order to encapsulate the actuator. It will be understood that although the sleeve now bears tightly against the actuator, the first and second ends of the tube present paths for the ingress of fluid into the interface between the coating and the encapsulated actuator.

It is known to provide a chemical adhesive or a filler material, as described for example in the Applicant's co-pending international application WO 02/061856, between the coating and the encapsulated actuator. However, even in this case the ingress of fluid between the coating and the actuator has been observed. The currently used adhesives are prone to degradation by fuel and ingress is usually observed after less than 2000 hours. It is reasonable to expect an injector to have a lifetime of 15 years (>130000 hours). A variety of different adhesives has been tried in an attempt to create durable end sealing, but it has been difficult to achieve consistent durable bonding.

End sealing has also been a problem with injection-moulded encapsulation. Increasing the end seal leak path with a labyrinth has met with varying degrees of success, but with the additional disadvantage that it cannot easily be used with ceramic components without extra cost being incurred. A further difficulty has been the tendency for piezoelectric elements to fracture during injection moulding.

It is an object of the present invention to alleviate the above mentioned problems but without adding significantly to the cost, complexity or size of the actuator.

SUMMARY OF THE INVENTION

According to the present invention, there is provided an actuator arrangement comprising a piezoelectric actuator having a body section, a shroud which enshrouds at least part of the body section of the actuator, and at least one constrictive member disposed externally with respect to the shroud. The at least one constrictive member applies a constrictive force to the shroud to maintain a seal between the shroud and the underlying body section of the actuator.

In a preferred embodiment of the invention, the shroud is flexible. Conveniently, the shroud conforms to the contour of the underlying body. Preferably the shroud presents a male seat surface to a female surface of the constrictive member.

In a preferred embodiment of the invention, the body section of the actuator is inserted into the shroud. The shroud may have the form of a sleeve, and the sleeve may be composed of a heat-shrinkable material. Alternatively, the shroud is conveniently formed on the body section of the actuator. The shroud may be formed by over-moulding, painting, dipping or spraying.

In an embodiment of the invention, the shroud is in contact with the underlying body section of the actuator. Alternatively, at least one intermediate layer is disposed between the shroud and the underlying body section of the actuator. The intermediate layer may be an adhesive layer or a filler layer. There may also be at least two intermediate layers including at least one adhesive layer and at least one filler layer.

In one embodiment of the invention, the constrictive member applies the constrictive force to the shroud resiliently. The constrictive member may have a diameter that is expanded resiliently to accommodate the underlying enshrouded body section of the actuator.

In a preferred embodiment, the constrictive member applies the constrictive force to the shroud by plastic deformation. For example, the constrictive member may be of heat-contractible material.

In a preferred embodiment, the constrictive member is of a shape-memory material. Conveniently, the material of the constrictive member is deformable by martensitic transformation of its crystal structure. The shape-memory material may be an alloy of nickel and titanium such as NiTiNOL. Alternatively, the alloy of nickel and titanium may be $Ni_{30}Pt_{30}Ti_{50}$. The alloy of nickel and titanium may also contain iron. Preferably, the iron is present in the alloy in a proportion less than about 3-4% of the alloy.

Conveniently, the actuator arrangement has a defined operational temperature range and the shape-memory material of the constrictive member has a defined martensitic transformation temperature that is outside that range. The operational temperature range of the actuator arrangement may be between about −40° C. and about +150° C.; hence, the defined martensitic transformation temperature may be about −60° C., or the defined martensitic transformation temperature may be more than about +150° C. Preferably, therefore, the martensitic transformation temperature is above the maximum operational temperature or is below the minimum operational temperature of the actuator arrangement.

When the constrictive member is formed from a shape-memory material, it may conveniently be a ring. The ring may have an internal diameter of about 7.5 mm and an external diameter of about 9.5 mm. The ring may also have a length of about 2 mm in a direction orthogonal to any diameter of the ring.

Conveniently, the constrictive member is generally annular. The constrictive member may have a cross-section defining a generally straight side facing the enshrouded body section of the actuator. The straight side may define a cylindrical female surface. The constrictive member may comprise at least one coil, and may comprise a plurality of coils. The coils of the plurality may co-operate to define a cylindrical female surface. Further, the constrictive member may comprise a coiled element having a cross-section defining a generally straight side facing the enshrouded body section of the actuator, in which said sides of successive coils align to define the cylindrical female surface. The cross-section of the coiled element may be generally oblong. Conveniently, the successive coils of the plurality may abut one another. Preferably, the constrictive member may be generally tubular.

The invention may also be expressed as a method of manufacturing an actuator arrangement, the method comprising: providing a piezoelectric actuator having a body section and a shroud which enshrouds at least part of the body section; and applying at least one constrictive member to the exterior of the shroud such that the constrictive member applies a constrictive force to the shroud to maintain a seal between the shroud and the underlying body section of the actuator.

The method may preferably comprise expanding the constrictive member before its application to the exterior of the shroud, then allowing or causing the constrictive member to shrink onto the shroud.

The method may comprise resiliently expanding the constrictive member before its application to the exterior of the shroud, then allowing the constrictive member to shrink onto the shroud by release of elastic deformation of the constrictive member. Resilient expansion of the constrictive member may be performed by sliding the constrictive member over a mandrel, or by inserting an expanding tool into the constrictive member, or by applying opposing forces to the free ends of a coiled constrictive member such that the coil unwinds slightly.

Alternatively, when the constrictive member is of a shape-memory alloy having a martensitic transformation temperature, the method may comprise expanding the constrictive member at a temperature below the martensitic transformation temperature before its application to the exterior of the shroud; then causing or allowing the temperature of the constrictive member to exceed the martensitic transformation temperature whereupon the constrictive member shrinks onto the shroud. The constrictive member may, for example, be expanded by about 8% before its application to the shroud.

This method may further comprise storing the expanded constrictive member at a temperature below the martensitic transformation temperature before its application to the exterior of the shroud. The method may also further comprise annealing heat treatment of the constrictive member before its expansion, which heat treatment may preferably be conducted at about 500 Celsius. The method may still further comprise forming the constrictive member before its annealing heat treatment, said forming step being performed at a temperature below the martensitic transformation temperature. Advantageously, the invention may further comprise cooling at least part of the enshrouded actuator to delay the onset of martensitic transformation upon application of the constrictive member to the exterior of the shroud.

The present invention extends to a fuel injector including an actuator arrangement of the invention as described herein or as manufactured by the method of the invention described herein. The actuator arrangement may be disposed in an accumulator volume of the injector.

BRIEF DESCRIPTION OF DRAWINGS

Embodiments of the present invention will now be described, by way of example only, with reference to the accompanying drawings, in which.

DETAILED DESCRIPTION OF THE PREFERRED EMBODIMENTS

Figure 1:
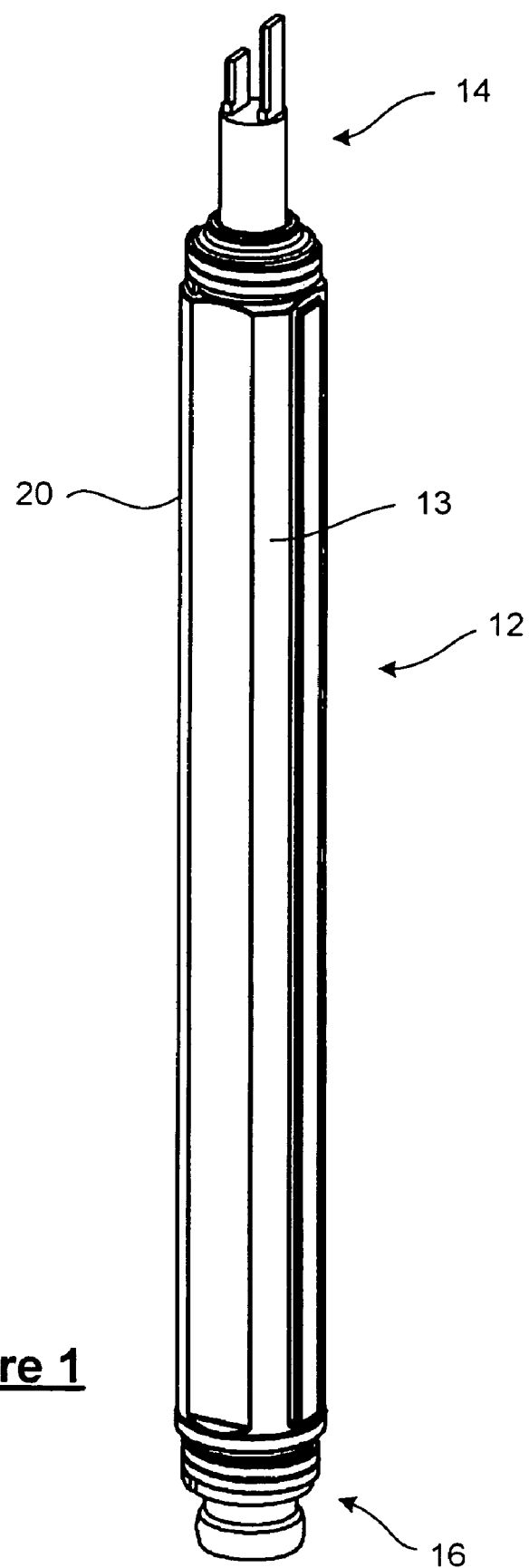
FIG. 1 is a perspective view of a known piezoelectric actuator arrangement including a first embodiment of the present invention.

FIG. 1 shows an actuator arrangement 10, which is elongate and generally cylindrical in shape. The arrangement 10 includes a known piezoelectric actuator 20 having at least one piezoelectric element (not shown), and is suitable for use in a fuel injector of an internal combustion engine.

The actuator 20 includes a generally cylindrical body section 12, comprising: a central major portion 13 containing a piezoelectric stack; and first and second end pieces 14 and 16 respectively. End piece 14, at the first end of body section 12, includes an electrical connector with first and second terminals which in use receives a voltage from a voltage supply (not shown). End piece 16, at the second end of body section 12, includes a load transmitting member which in use cooperates with a control piston or valve needle (not shown) of the fuel injector.

Figure 2:
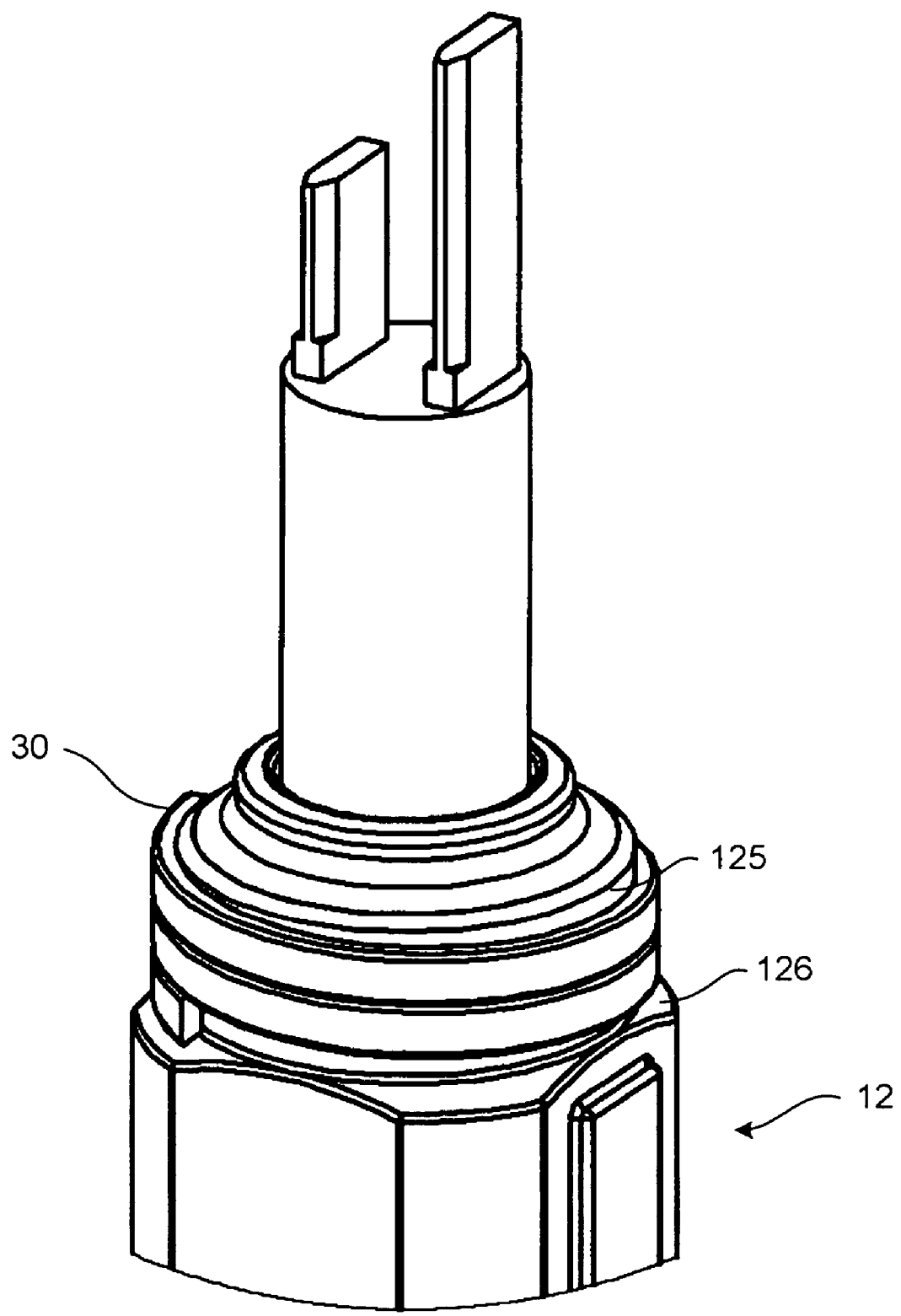
FIG. 2 is an enlarged detail perspective view of a first end of the actuator arrangement of FIG. 1, including the first embodiment of the present invention.

As shown in FIG. 2, inwardly of the electrical connector at the first end of body section 12, end piece 14 is narrower than the major portion 13 such that in longitudinal cross-section the first end of body section 12 has a stepped profile comprising neck 125 and shoulder 126. Although not shown is FIG. 2, it will be appreciated that inwardly of the load transmitting member at the second end of body section 12, end piece 16 is narrower than the major portion 13, apart from the similarly narrow neck 125 at the first end, such that in longitudinal cross-section the second end of body section 12 has a stepped profile comprising neck 127 and shoulder 128.

Details of the piezoelectric stack and internal components of actuator 20 and a description of how the actuator operates are disclosed fully in the Applicant's granted patent EP 0995901, so will not be discussed here.

Figure 3:
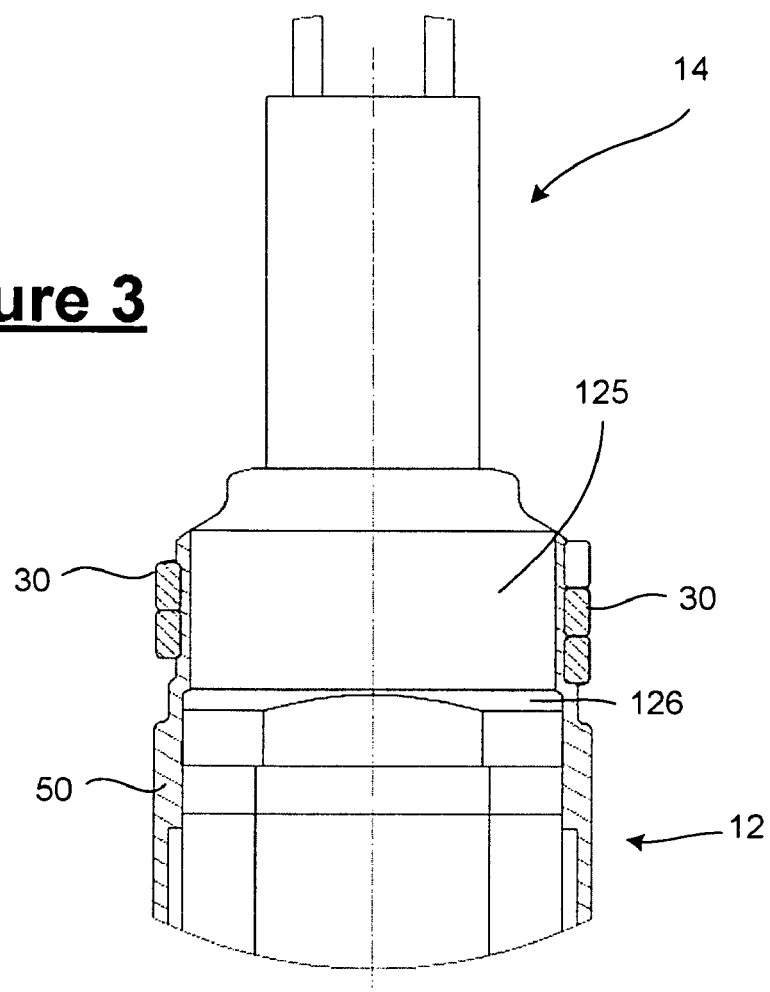
FIG. 3 is an enlarged sectional view of the first end of the actuator arrangement of FIG. 1, including the first embodiment of the present invention.
Figure 4:
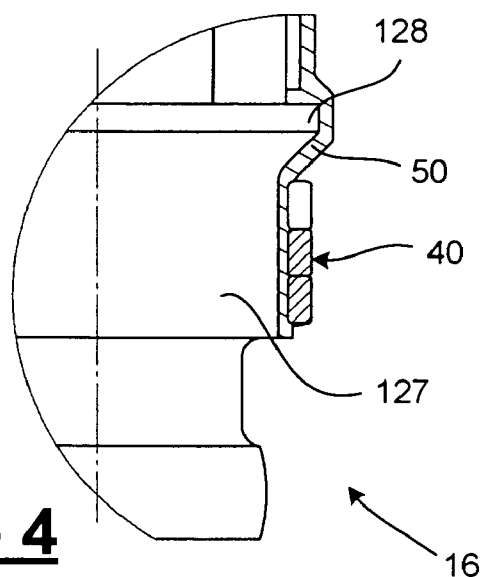
FIG. 4 is an enlarged sectional detail view of part of the second end of the actuator of FIG. 1, including the first embodiment of the present invention.

Referring to FIGS. 2 to 4, there are provided in accordance with a first embodiment of the present invention coiled clips 30, 40 at the first and second ends respectively of body section 12. The successive coils of clips 30, 40 abut one another, such that each clip 30, 40 defines a ring in the form of a short expandable tube.

As shown in detail in FIG. 2, clip 30 encircles body section 12 at neck 125, outwardly of shoulder 126. Additionally, it will be appreciated that clip 40 encircles body section 12 at neck 127, outwardly of shoulder 128. The location of clips 30 and 40 can be seen in more detail in the sectional views of FIGS. 3 and 4.

Evident from FIGS. 3 and 4 is the presence of a flexible sleeve 50, which enshrouds and is conformed to the contours of body section 12. Sleeve 50 extends along the length of body section 12 from end piece 14 to end piece 16.

Referring to FIG. 3, clip 30 is positioned externally with respect to sleeve 50 around neck 125 of body section 12, such that the interior surface of clip 30 bears against the exterior of sleeve 50. Clip 30 is formed from a conventional spring wire material that can be expanded and contracted resiliently to vary its internal diameter. When positioned around neck 125, clip 30 exerts a constrictive force upon sleeve 50 sufficient to urge the interior of sleeve 50 against the exterior of body section 12. The constrictive force is sufficiently strong that a fluid-tight seal is maintained at the interface between sleeve 50 and body section 12 beneath clip 30.

From FIG. 4 it can be seen that clip 40 is positioned externally with respect to sleeve 50 around neck 127, and forms a seal in the same way as described for clip 30.

Clips 30 and 40 encircle necks 125, 127 respectively by at least two full turns of their coils around the circumference of those regions. The coiled shape provides a large, substantially continuous area of contact pressure against sleeve 50 beneath clips 30, 40, while minimising the external diameter of actuator arrangement 10.

From FIGS. 3 and 4 it can been seen that clips 30, 40 are coiled from a wire of an oblong cross-section with straight sides and rounded corners. Such a cross-sectional shape exerts a substantially even pressure on sleeve 50 beneath clips 30, 40. It also minimises the likelihood of creating a helical path of low contact pressure between the coils of clips 30, 40, which could otherwise allow for the migration of fluid into the interface between sleeve 50 and necks 125, 127.

During assembly, clip 30 is expanded, positioned, and then allowed to contract into place over sleeve 50 at neck 125. Clip 40 is similarly positioned over sleeve 50 at neck 127 in the same way. Expansion may be achieved, for example, mechanically by sliding the clip 30, 40 over a mandrel, or by inserting an expanding tool into the clip 30, 40, or by applying opposing forces to the free ends of the coil such that the coil unwinds slightly. Once positioned correctly over the sleeve 50 at neck 125 or 127 as appropriate, the expanded clip 30, 40 is simply allowed to contract elastically to constrict the sleeve 50 and seal it against the underlying body section 12.

Figure 5:
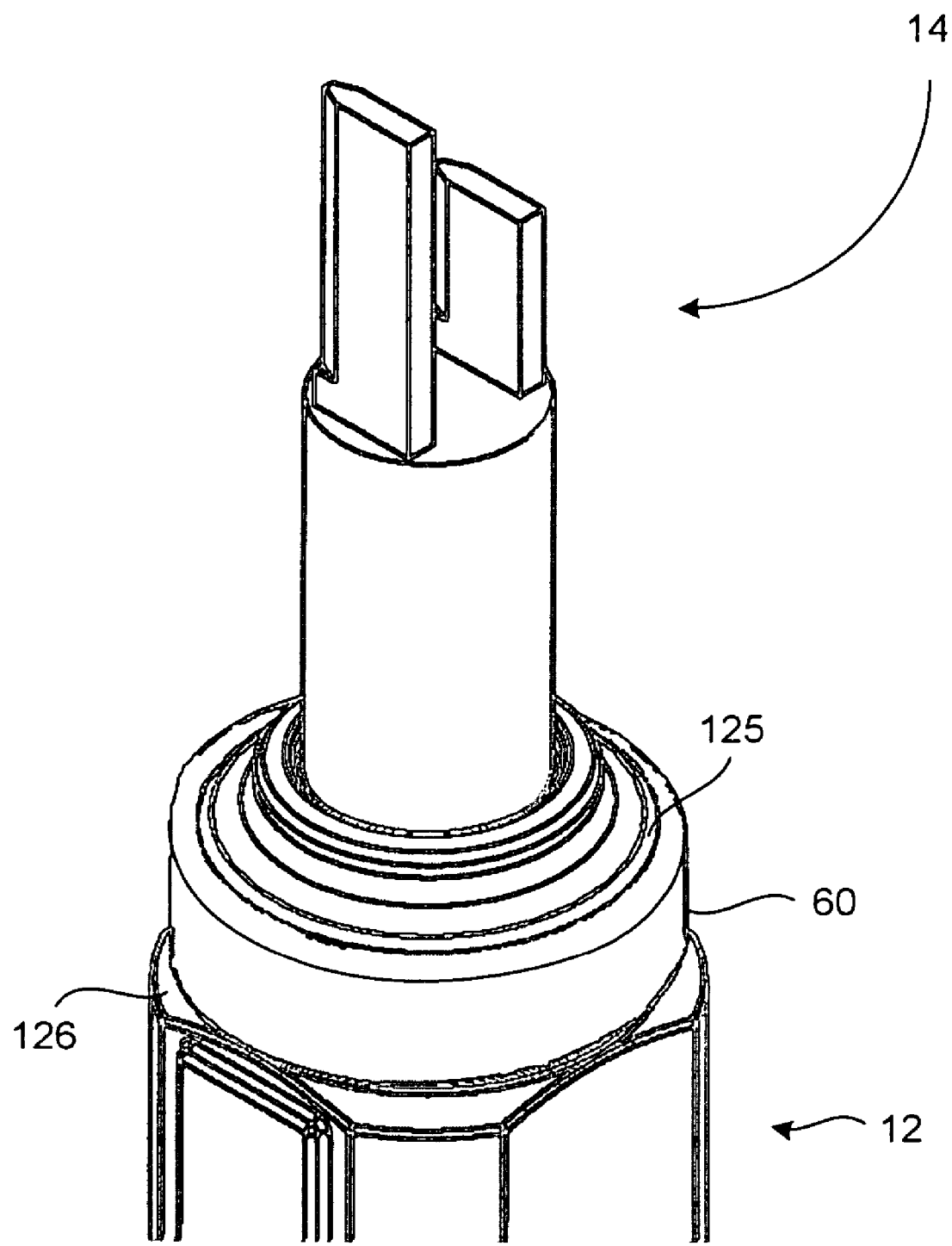
FIG. 5 is an enlarged detail perspective view of a first end of an actuator arrangement corresponding to FIG. 1, but including an annular clip in a second, presently preferred embodiment of the present invention.

Referring to FIG. 5, there is provided in accordance with a second, presently preferred embodiment of the present invention an annular clip 60 at the first end of body section 12 of actuator 20. Clip 60 encircles body section 12 at neck 125, outwardly of shoulder 126. It is to be appreciated that a similar annular clip 60 could be provided at the second end of body section 12 (not shown in this Figure) to encircle body section 12 at neck 127, outwardly of shoulder 128. Clips 60 encircle necks 125, 127 by one full turn around the circumference of those regions.

Clips 60 are positioned externally with respect to sleeve 50 around necks 125, 127 respectively of body section 12 such that the interior female surface of each clip 60 bears against the exterior of sleeve 50. When positioned around necks 125, 127, clips 60 exert a constrictive force upon sleeve 50 sufficient to urge the interior of sleeve 50 against the exterior of body section 12. The constrictive force is sufficiently strong that a fluid-tight seal is maintained at the interfaces between sleeve 50 and body section 12 beneath clips 60.

Figure 6:
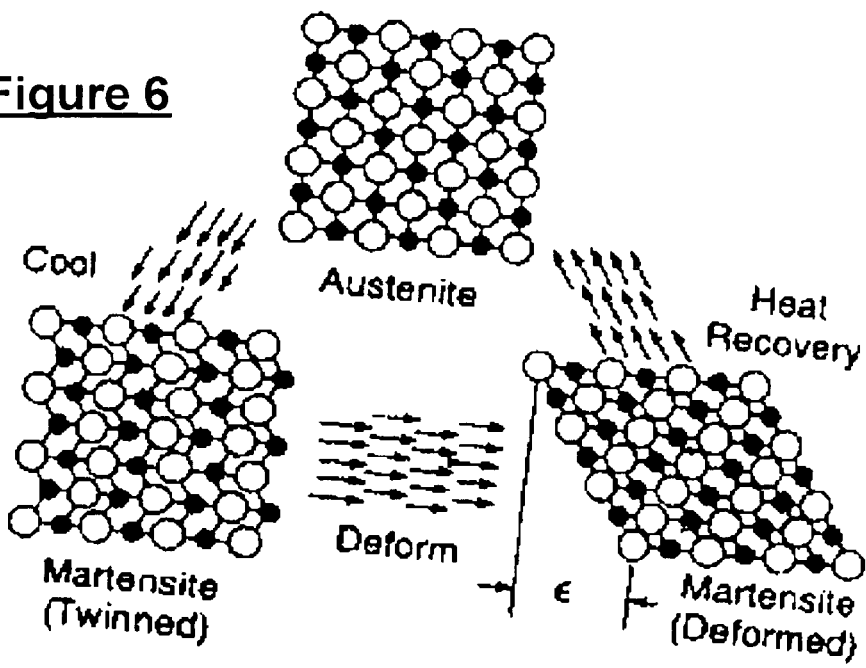
FIG. 6 is a schematic representation of the changes in crystal form of a shape-memory alloy that underpin the shape-memory effect.

Clips 60 are formed from a shape-memory material comprising, for example, an alloy of nickel and titanium. Such a shape-memory alloy is capable of undergoing quite severe mechanical deformation at one temperature, and yet for a moderate increase in temperature returns to its original shape. This phenomenon is due to a thermo-elastic martensitic transformation. With reference to FIG. 6, it will be appreciated that at temperatures lower than a defined martensitic transformation temperature, the alloy has a martensitic crystal structure; at temperatures higher than the defined martensitic transformation temperature, the alloy has an austenitic structure. When most metals and alloys plastically deform, the shape change involves the movement of dislocations and slip planes. However, in the case of the shape-memory alloy, deformation in the low temperature martensitic form occurs by reorganisation of the twinned crystal structure. If the deformed martensitic alloy is then taken to a temperature above the martensitic transformation temperature, there is a transformation to austenitic crystal structure, the earlier deformation due to twin reorganisation is reversed, and the alloy returns to its original shape.

Figure 7A:
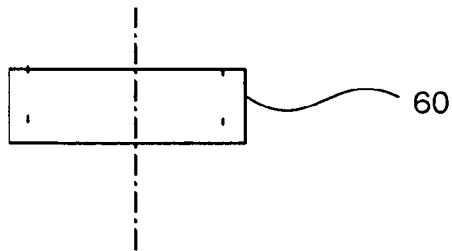
FIGS. 7a, 7b and 7c are schematic representations of a preferred technique for manufacturing a clip for use in the second embodiment of the invention as shown in FIG. 5.
Figure 7B:
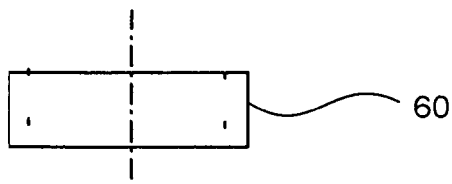
Figure 7C:
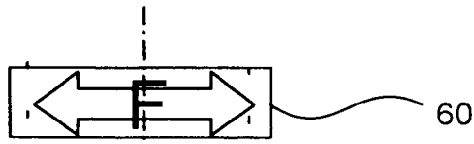

A preferred technique for manufacturing clip 60 is shown in FIGS. 7a, 7b and 7c. During manufacture, clip 60 is formed to the size and shape as would be required in use, by cold working to the desired final dimensions at a temperature below the martensitic transformation temperature, as shown in FIG. 7a, followed by annealing heat treatment to establish the desired shape-memory strain, as shown in FIG. 7b. Each clip 60 is then returned to a temperature below the martensitic transformation temperature such that the crystal structure of the clip is in the twinned martensitic form, whereupon the clip 60 is mechanically deformed to increase its circumference by approximately 8% as shown in FIG. 7c.

An annealing heat treatment temperature of around 500° C. is typical when aiming to maximize shape memory strain, as described in *Using Nitinol Alloys*, Johnson Matthey, 2004. It will be appreciated that other temperatures may be used.

After manufacture, the clips 60 may be stored at a temperature below the martensitic transformation temperature prior to assembly onto the actuator arrangement 10.

Figure 8A:
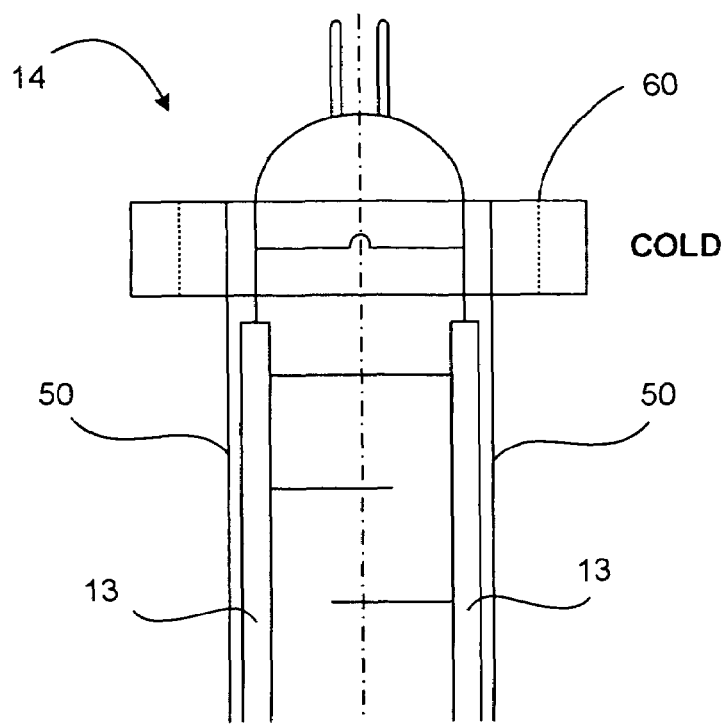
FIGS. 8a and 8b are schematic representations of a preferred technique for assembling the actuator arrangement of FIG. 5 including an annular clip in accordance with the second embodiment of the present invention.
Figure 8B:
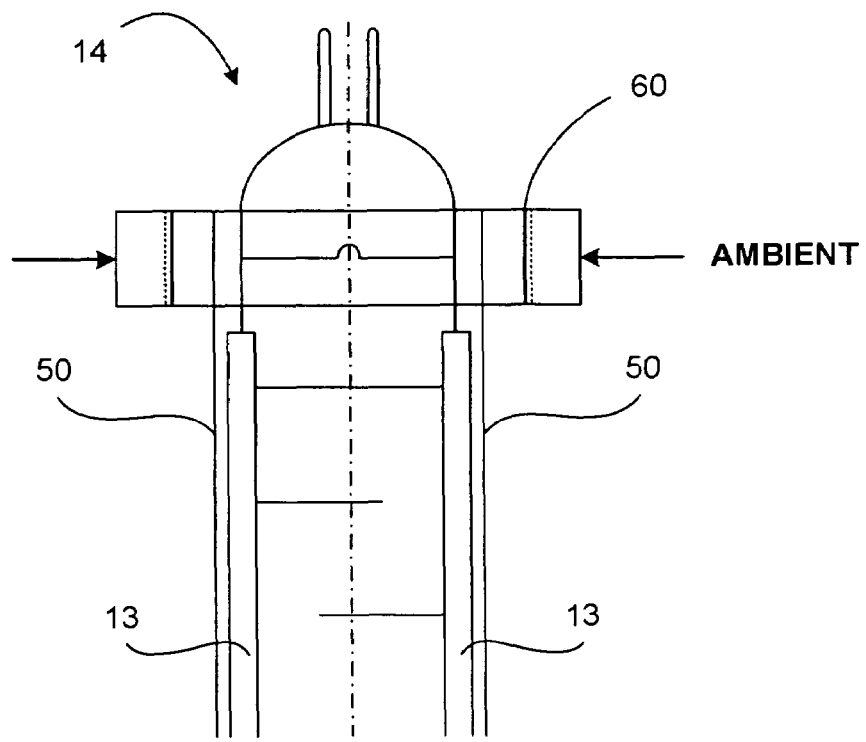

A preferred assembly technique is shown in FIGS. 8a and 8b. Deformed clips 60 are positioned over sleeve 50 at necks 125, 127 at a temperature below the martensitic transformation temperature, as shown in FIG. 8a. The positioned deformed clips 60 are then returned, or allowed to return, to a temperature above the martensitic transformation temperature. As the clips 60 pass above the martensitic transformation temperature there is a thermo-elastic transition such that the crystal structure transforms from a martensitic structure to an austenitic structure, and the circumference of the clips 60 decreases as shown in FIG. 8b. By means of the shape-memory transition strain, the clips 60 constrict sleeve 50 and seal its ends against the underlying body section 12.

During assembly, if the shape-memory alloy composition of the clip 60 and the heat treatment conditions have been selected such as to cause the clip 60 to undergo an 8% martensitic-to-austenitic phase transition shrinkage at −50° C., there will be sufficient clearance to assemble the clip 60 into place over the sleeve 50 and the underlying actuator 10. It will be appreciated that if the enshrouded actuator 10 is cooled down as well as clip 60 during assembly, clip 60 will warm up more slowly giving more handling time before the transition-induced shrinkage of clip 60 occurs.

In preferred embodiments, the actuator arrangement 10 may be expected to have an operating temperature range of −40° C. to +150° C. It will be appreciated that the martensitic transformation temperature of the alloy of clips 60 must be outside the working temperature range of actuator arrangement 10. Thus, it will also be appreciated that fitting clips 60 into position at necks 125, 127 respectively of actuator 20 must take place at a temperature outside the operating temperature range of actuator arrangement 10.

Conveniently, the shape-memory alloy of clips 60 may be NiTiNOL, an alloy of nickel and titanium, which is the most widely used shape-memory alloy. The recoverable deformation of NiTiNOL can be as much as 8% strain for single cycle use. By changing the relative proportions of nickel and titanium in the alloy, the martensitic transformation temperature can be varied from −50 to +110° C. The inclusion in the alloy of additional elements can alter the transformation temperature further. For example, introduction of from 3% to 4% iron into NiTiNOL lowers the transformation temperature to −100° C. as described in *Using Nitinol Alloys*, Johnson Matthey, 2004. Conveniently, a NiTiNOL alloy with added iron such that it has a transition temperature of −60° C. should be suitable, as this is 20° C. below the anticipated minimum operating temperature of the actuator arrangement 10 (−40° C.). This allows room for error in assessing the transition temperature of the alloy and for the occurrence of unexpected extremes of temperature within the actuator arrangement in use, for example due to extreme weather.

NiTiNOL is widely available and relatively cheap. In large quantities, NiTiNOL costs in the region of USD 100 per kg for simple shapes such as flat rings, as described in *Using Nitinol Alloys*, Johnson Matthey, 2004. By way of example, each clip 60 that has an internal diameter of 7.5 mm, is 1 mm thick and 2 mm long, uses approximately 47 mm$^3$ of NiTiNOL. Given these specifications, around 3300 clips could be made per kilogram of NiTiNOL, at an estimated component cost of less than 3 cents per clip.

It will be appreciated that other NiTiNOL compositions are also known with suitable transition temperatures. For example, the shape memory alloy of the clips 60 may be $Ni_{30}Pt_{30}Ti_{50}$. This material has a transition temperature above 150° C., which is the anticipated maximum operational temperature of the actuator arrangement 10. This material can also be formed so as to produce sufficient shape-memory transition strain to form a seal in accordance with the present invention. Properties of this material are described in Noebe, R. D.; Biles, T.; and Padula II, S. A.: *NiTi-Based High-Temperature Shape-Memory Alloys: Properties, Prospects, and Potential Applications*, NASA/TM—2005-213104, 2005.

The clamping stress created by clips 60 and in turn the sealing stress created between sleeve 50 and the underlying actuator 10 is not described in detail, as this will depend upon the actual properties of the sleeve, and the mechanical properties and dimensions of the shape-memory alloy. Based on the available figures, a NiTiNOL clip of internal diameter 7.5 mm and external diameter 9.5 mm would provide sufficient clamping.

If sleeve 50 is composed of PVDF, then it is estimated that based on a bulk modulus of 3 GPa, a clamping load of 30 MPa (compressive strength 40 MPa) can be generated by clip 60 compressing sleeve 50 by 1%.

By means of the invention, the seal formed by any of clips 30, 40 or 60 has sufficient integrity to resist the passage of fluids into the interface between sleeve 50 and body section 12. In use such fluids may include, for example, high-pressure fuel, hydrostatic pressurising fluid, or moisture from the environment. Nevertheless, the presently preferred embodiment of the invention exemplified by annular clip 60 offers the advantage that there is no possibility of the formation of a helical ingress path between sleeve 50 and body section 12 under clip 60. In addition, the formation of clip 60 from an annular piece of shape-memory alloy material may provide a greater clamping load compared to that provided by other materials or clip configurations, including those that rely upon resilience due to elastic deformation.

Many variations are possible within the inventive concept. For example, it will be appreciated that the piezoelectric actuator 20 may be of any type. The end pieces 14, 16 may be at least in part formed from a ceramic material.

The sleeve 50 is an example of various shrouds that could be used to enshroud the body section 12 of actuator 20. For example, the shroud may be a tube with first and second open ends such that the actuator 20 can be inserted into the open tube. The sleeve may be composed of an elastically expanded material allowed to contract to fit the shape of the actuator, or could be an over-moulded polymer or elastomer, or could be a dipped, painted or sprayed coating.

There may in addition optionally be at least one adhesive or filler materials or substances, or combinations thereof, disposed between the exterior surface of the actuator and the interior surface of the shroud.

It will be appreciated that clips 30, 40 and 60 could optionally be coiled, circular or c-shaped. Preferably, the clip is shaped such that its internal female surface compliments the external male surface of the enshrouded actuator at the location of the clip.

In alternative embodiments the clip could be square, round, triangular, trapezoidal or any other appropriate shape in cross-section.

In the preferred embodiments presented here the clips are identically formed at each end of the actuator arrangement. Equally, however, each clip could be individually shaped, particularly if the first and second ends of the actuator are differently shaped.

Having described particular preferred embodiments of the present invention, it is to be appreciated that the embodiments in question are exemplary only and that variations and modifications such as will occur to those possessed of the appropriate knowledge and skills may be made without departure from the scope of the invention as set forth in the appended claims.

What is claimed is:

1. An actuator arrangement comprising:
   a piezoelectric actuator having a body section, said body section defining a central longitudinal axis;
   a shroud which enshrouds at least part of the body section of the actuator at a location along said central longitudinal axis; and
   at least one constrictive member, positioned at said location along said central longitudinal axis and disposed externally with respect to the shroud;
   wherein the constrictive member applies a constrictive force, to the shroud and generally toward said central longitudinal axis, so as to maintain a seal between the shroud and the underlying body section of the actuator;
   wherein the constrictive member is a helical coil, has an inner surface facing the enshrouded body section of the actuator, and said inner surface is cylindrical.

2. The actuator arrangement of claim 1, wherein the shroud is flexible.

3. The actuator arrangement of claim 1, wherein the shroud conforms to the contours of the underlying body section.

4. The actuator arrangement of claim 1, wherein the shroud presents a male seat surface to a female surface of the constrictive member.

5. The actuator arrangement of claim 1, wherein the body section of the actuator is inserted into the shroud.

6. The actuator arrangement of claim 5, wherein the shroud is a sleeve.

7. The actuator arrangement of claim 6, wherein the sleeve is composed of a heat-shrinkable material.

8. The actuator arrangement of claim 1, wherein at least one intermediate layer is disposed between the shroud and the underlying body section of the actuator.

9. The actuator arrangement of claim 8, wherein the intermediate layer is an adhesive layer or a filler layer.

10. The actuator arrangement of claim 8, wherein there are at least two intermediate layers including at least one adhesive layer and at least one filler layer.

11. The actuator arrangement of claim 1, wherein the shroud is formed on the body section of the actuator.

12. The actuator arrangement of claim 11, wherein the shroud is formed by over-moulding, painting, dipping or spraying.

13. The actuator arrangement of claim 1, wherein the shroud is in contact with the underlying body section of the actuator.

14. The actuator arrangement of claim 1, wherein the constrictive member applies the constrictive force to the shroud resiliently.

15. The actuator arrangement of claim 14, wherein the constrictive member has a diameter that is expanded resiliently to accommodate the underlying enshrouded body section of the actuator.

16. The actuator arrangement of claim 1, wherein the constrictive member applies the constrictive force to the shroud by plastic deformation.

17. The actuator arrangement of claim 16, wherein the constrictive member is of heat-contractible material.

18. The actuator arrangement of claim 16, wherein the constrictive member is of a shape-memory material.

19. The actuator arrangement of claim 18, wherein the actuator arrangement has an operational temperature range and wherein the shape-memory material of the constrictive member has a defined martensitic transformation temperature that is outside that temperature range.

20. The actuator arrangement of claim 1, wherein the constrictive member is generally annular.

21. The actuator arrangement of claim 20, wherein the constrictive member is generally tubular.

22. The actuator arrangement of claim 1, wherein the straight side defines a cylindrical female surface.

23. The actuator arrangement of claim 20, wherein the constrictive member comprises at least one coil.

24. The actuator arrangement of claim 23, wherein the constrictive member comprises a plurality of coils and the coils of the plurality co-operate to define a cylindrical female surface.

* * * * *